US012310072B2

(12) United States Patent
Wang et al.

(10) Patent No.: US 12,310,072 B2
(45) Date of Patent: May 20, 2025

(54) MIDDLE OF LINE STRUCTURE WITH STACKED DEVICES

(71) Applicant: INTERNATIONAL BUSINESS MACHINES CORPORATION, Armonk, NY (US)

(72) Inventors: Junli Wang, Slingerlands, NY (US); Su Chen Fan, Cohoes, NY (US); Ruqiang Bao, Niskayuna, NY (US); Albert M. Young, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 647 days.

(21) Appl. No.: 17/547,775

(22) Filed: Dec. 10, 2021

(65) Prior Publication Data

US 2023/0187491 A1 Jun. 15, 2023

(51) Int. Cl.
*H10D 62/10* (2025.01)
*H01L 23/528* (2006.01)
(Continued)

(52) U.S. Cl.
CPC ....... *H10D 62/116* (2025.01); *H01L 23/5286* (2013.01); *H10D 30/6735* (2025.01); *H10D 30/6757* (2025.01); *H10D 62/121* (2025.01); *H10D 84/0193* (2025.01); *H10D 84/038* (2025.01); *H10D 84/853* (2025.01)

(58) Field of Classification Search
None
See application file for complete search history.

(56) References Cited

U.S. PATENT DOCUMENTS 9,653,461 B2 5/2017 Huang et al.
10,056,377 B2 8/2018 Bentley et al.
(Continued)

FOREIGN PATENT DOCUMENTS

WO 2016204755 A1 12/2016

OTHER PUBLICATIONS

Gaillardon et al., "Vertically-Stacked Double-Gate Nanowire FETs with Controllable Polarity: From Devices to Regular ASICS", In 2013 Design, Automation & Test in Europe Conference & Exhibition (Date) Mar. 1, 20138 (pp. 625-630). IEEE.

*Primary Examiner* — Scott B Geyer
(74) *Attorney, Agent, or Firm* — Tutunjian & Bitetto, P.C.; L. Jeffrey Kelly

(57) ABSTRACT

A field effect device is provided. The field effect device includes a lower active gate structure on a substrate, and a first lower source/drain on a first side of the lower active gate structure. The field effect device further includes a second lower source/drain on a second side of the lower active gate structure opposite the first side, and a first lower source/drain contact interface on the first lower source/drain. The field effect device further includes a first upper source/drain on the first side of an upper active gate structure, and a second upper source/drain on the second side of the upper active gate structure opposite the first side. The field effect device further a shared source/drain contact forming an electrical connection between the first lower source/drain and the first upper source/drain; and a lower source/drain contact forming an electrical connection to the second lower source/drain.

14 Claims, 10 Drawing Sheets

FIG. 2

(51) Int. Cl.
  *H10D 30/67* (2025.01)
  *H10D 84/01* (2025.01)
  *H10D 84/03* (2025.01)
  *H10D 84/85* (2025.01)

(56) References Cited

U.S. PATENT DOCUMENTS

| | | | |
|---|---|---|---|
| 10,236,350 B2 | 3/2019 | Bouche et al. | |
| 10,263,122 B1 | 4/2019 | Zang et al. | |
| 10,763,343 B2 | 9/2020 | Reznicek et al. | |
| 12,132,044 B2* | 10/2024 | Kim | H10D 84/038 |
| 2019/0131184 A1* | 5/2019 | Ando | H10D 30/6757 |
| 2019/0131394 A1* | 5/2019 | Reznicek | H10D 30/6739 |
| 2019/0131396 A1* | 5/2019 | Zhang | B82Y 10/00 |
| 2019/0172828 A1* | 6/2019 | Smith | H10D 86/60 |
| 2020/0126987 A1* | 4/2020 | Rubin | H10D 84/0186 |
| 2020/0203341 A1* | 6/2020 | Barraud | H10D 88/01 |
| 2020/0212036 A1* | 7/2020 | Yamashita | H10D 62/115 |
| 2020/0294995 A1* | 9/2020 | Kim | H10D 84/83 |
| 2020/0365464 A1* | 11/2020 | Sreenivasan | H10D 30/6757 |
| 2020/0402984 A1* | 12/2020 | Reznicek | H01L 21/02532 |
| 2021/0265348 A1* | 8/2021 | Xie | H10D 88/01 |
| 2021/0366907 A1* | 11/2021 | Liao | H10D 84/038 |
| 2022/0109046 A1* | 4/2022 | Hong | H10D 84/038 |
| 2022/0190167 A1* | 6/2022 | Ando | H10D 64/01 |
| 2022/0216340 A1* | 7/2022 | Lin | H10D 84/013 |
| 2023/0085628 A1* | 3/2023 | Xie | H10D 84/0135 257/369 |
| 2023/0103999 A1* | 4/2023 | Zhou | H10D 30/6729 257/351 |
| 2023/0125316 A1* | 4/2023 | Xie | H10D 84/0172 257/351 |
| 2023/0143705 A1* | 5/2023 | Seshadri | H10D 30/031 257/351 |
| 2023/0187507 A1* | 6/2023 | Majhi | H10D 30/6729 |

* cited by examiner

MIDDLE OF LINE STRUCTURE WITH STACKED DEVICES

BACKGROUND

The present invention generally relates to middle of line structures, and more particularly to middle of line structures for stacked field effect devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows from a source to a drain. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a field effect device is provided. The field effect device includes a lower active gate structure on a substrate, and a first lower source/drain on a first side of the lower active gate structure. The field effect device further includes a second lower source/drain on a second side of the lower active gate structure opposite the first side, and a first lower source/drain contact interface on the first lower source/drain. The field effect device further includes a first upper source/drain on a first side of an upper active gate structure, and a second upper source/drain on a second side of the upper active gate structure opposite the first side. The field effect device further includes a shared source/drain contact forming an electrical connection between the first lower source/drain and the first upper source/drain, and a lower source/drain contact forming an electrical connection to the second lower source/drain.

In accordance with another embodiment of the present invention, a field effect device is provided. The field effect device includes a first lower source/drain on a substrate, and a second lower source/drain on the substrate. The field effect device further includes one or more lower semiconductor nanosheets between the first lower source/drain and the second lower source/drain, and a first lower source/drain contact interface on the first lower source/drain. The field effect device further includes a first upper source/drain above the first lower source/drain, and a second upper source/drain above the second lower source/drain. The field effect device further includes one or more upper semiconductor nanosheets between the first upper source/drain and the second upper source/drain, and a shared source/drain contact forming an electrical connection between the first lower source/drain and the first upper source/drain. The field effect device further includes a lower source/drain contact forming an electrical connection to the second lower source/drain.

In accordance with yet another embodiment of the present invention, a method of forming a field effect device is provided. The method includes forming one or more lower semiconductor nanosheets in a first stack on a substrate, and forming a first lower source/drain on a first side of the one or more lower semiconductor nanosheets. The method further includes forming a second lower source/drain on a second side of the one or more lower semiconductor nanosheets opposite the first side, and forming a lower gate structure on the one or more lower semiconductor nanosheets. The method further includes forming a bonding layer on the lower gate structure, the first lower source/drain, and the second lower source/drain, and forming one or more upper semiconductor nanosheets in a second stack on the bonding layer above the one or more lower semiconductor nanosheets in the first stack. The method further includes forming an upper gate structure on the one or more upper semiconductor nanosheets, and forming a shared gate electrode electrically connecting the upper gate structure to the lower gate structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide vertically stacked field effect devices with lower aspect ratio interconnects. Electrical contacts can be shared between top and bottom source/drains. A shared electrical connection can be formed between the upper and lower gate structures.

Exemplary applications/uses to which the present invention can be applied include, but are not limited to: stacked field effect devices.

It is to be understood that aspects of the present invention will be described in terms of a given illustrative architecture; however, other architectures, structures, substrate materials and process features and steps can be varied within the scope of aspects of the present invention.

Figure 1:
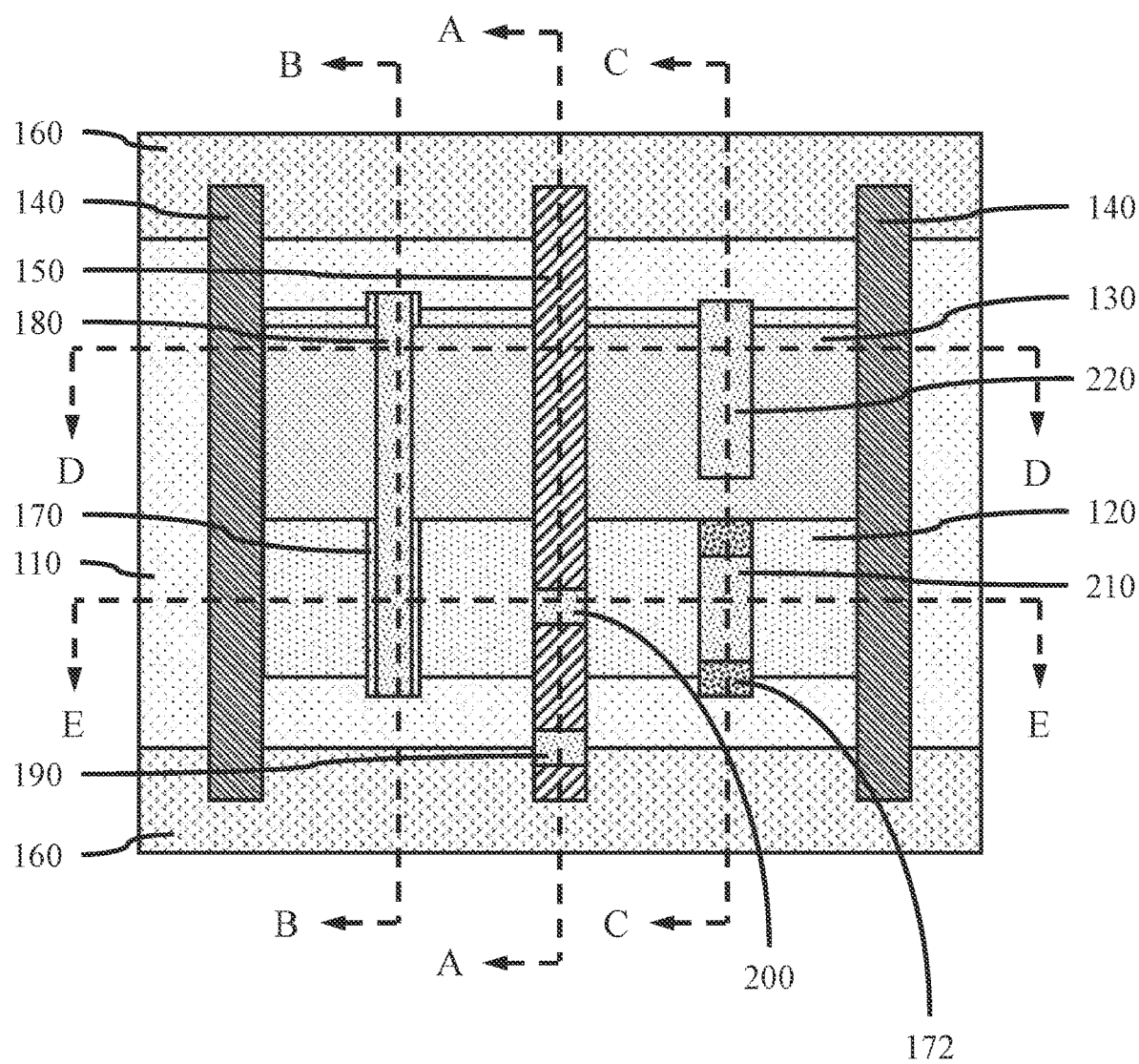
FIG. 1 is a top view showing stacked devices with shared and separate source/drain contacts, in accordance with an embodiment of the present invention.

Referring now to the drawings in which like numerals represent the same or similar elements and initially to FIG. 1, FIG. 1 is a top view showing stacked devices with shared and separate source/drain contacts, in accordance with an embodiment of the present invention.

In one or more embodiments, an upper field effect transistor (FET) device can be formed on a lower field effect transistor device, where electrical contacts can be shared by the upper and lower devices. The lower FET can include a lower active device region 120 having a lower device channel on a substrate 110, where the lower device channel can be formed by semiconductor nanosheets. The upper FET can include an upper active device region 130 having an upper device channel above the lower device channel, where the upper device channel can be formed by semiconductor nanosheets. The lower FET can have wider device channels than the upper FET.

In various embodiments, the lower active device region 120 can include lower source/drains on opposite sides of the device channel, and the upper active device region 130 can include upper source/drains on opposite sides of the device channel.

In one or more embodiments, an active gate structure can be formed across the upper FET and the lower FET, and dummy gate structures can be at opposites ends of the upper and lower field effect devices A dummy gate structure can include the same device components as an active gate structure, but without a voltage connection. An upper active gate cap 150 can be formed on the active gate structure over the upper device channels and the lower device channels. A conductive gate electrode can be formed on the upper device channel and the lower device channel. An upper dummy gate cap 140 can be formed on the dummy gate structures over upper device channels and lower device channels.

In various embodiments, dielectric gate cut slabs 160 can be formed on opposite ends of the active gate structure(s) and dummy gate structure(s), where the dielectric gate cut slabs 160 can partition the gate structures between adjacent FET devices.

In one or more embodiments, a first lower source/drain contact interface 170 can be formed on one of the lower source/drains for the lower FET device on one side of the active gate structure.

In one or more embodiments, a shared source/drain contact 180 can be formed to the one of the lower source/drains and one of the upper source/drains, where the shared source/drain contact 180 can electrically connect the upper and lower source/drains on the same side of the active gate structure.

In one or more embodiments, a shared gate contact 190 can be formed between the upper conductive gate electrode and the lower conductive gate electrode, where the shared gate contact 190 can intersect the active gate structure on the upper and lower device channels.

In one or more embodiments, an upper gate contact 200 can be formed to the upper active gate structure. An upper gate contact may not be formed to the dummy gate structure(s) to render them inactive, although including the same components as the active gate structure.

In one or more embodiments, a lower source/drain contact 210 can be formed to the lower source/drain on the side of the active gate structure opposite the source/drain connected to the shared source/drain contact 180, where the lower source/drain contact 210 can electrically connect to the lower source/drain. The lower source/drain contact 210 can be electrically connected to a second lower source/drain contact interface 172 on the second lower source/drain.

In one or more embodiments, an upper source/drain contact 220 can be formed to the upper source/drain on the opposite side of the active gate structure from the shared source/drain contact 180. The upper source/drain contact 220 can be electrically connected to the upper source/drain.

Figure 2:
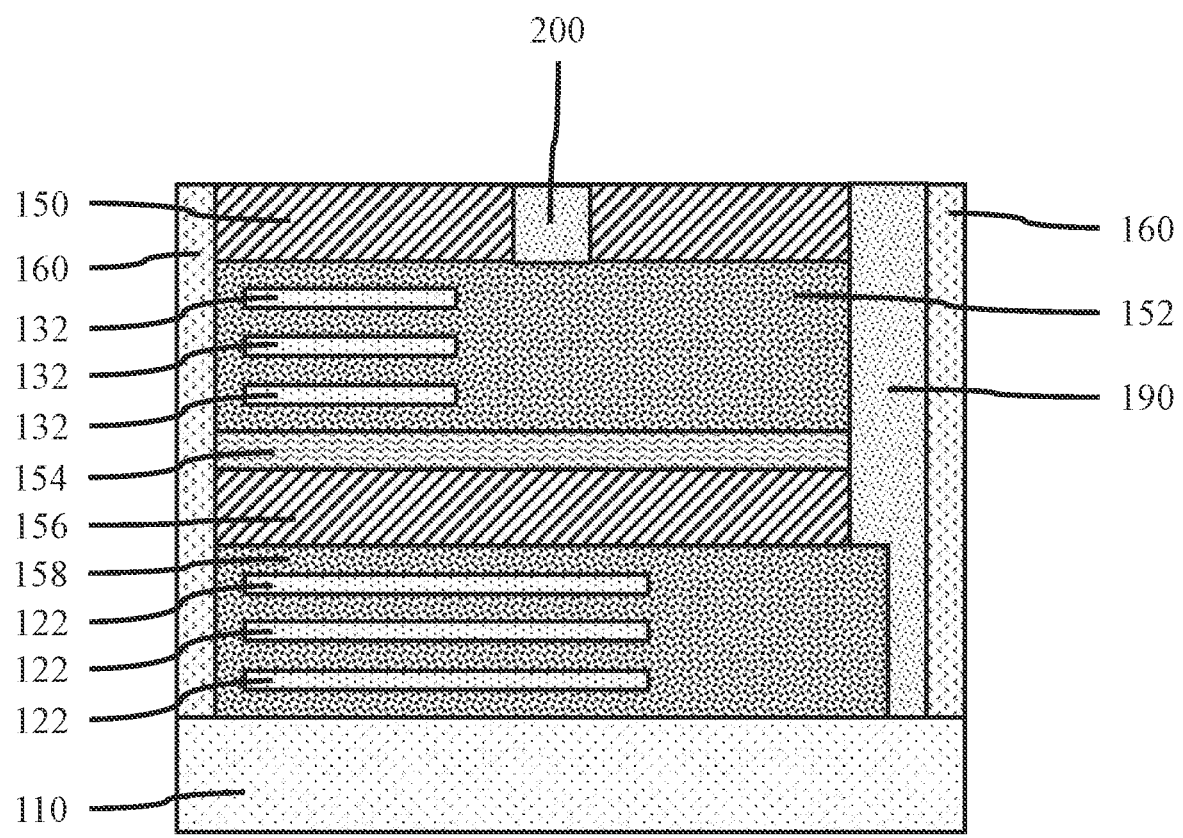
FIG. 2 is a cross-sectional side view showing the A-A cross-section of the top view in FIG. 1 along the long axis of the active gate structure on the field effect device channels, in accordance with an embodiment of the present invention.

FIG. 2 is a cross-sectional side view showing the A-A cross-section of the top view in FIG. 1 along the long axis of the active gate structure on the field effect device channels, in accordance with an embodiment of the present invention.

In one or more embodiments, a lower device channel can be formed on a substrate 110, where the lower device channel can include a stack of lower semiconductor nanosheets 122 on the substrate 110. The lower semiconductor nanosheets 122 can have a first width. The substrate 110 can be an electrically insulating dielectric material, including, but not limited to, silicon oxide (SiO), silicon nitride (SiN), silicon oxynitride (SiON), silicon oxycarbide (SiOC), organosilicate glass (SiOCH), silicon borocarbonitride (SiBCN), and combinations thereof. The substrate 110 can electrically insulate the FET devices from an underlying semiconductor material.

In various embodiments, the lower gate structure can include a gate dielectric layer on the lower semiconductor nanosheets 122 and a lower conductive gate electrode 158 on the gate dielectric layer that wraps around the lower semiconductor nanosheets 122. A lower active gate cap 156 can be formed on the lower conductive gate electrode 158. The lower conductive gate electrode 158 can include a first work function material and/or a first conductive gate fill.

In one or more embodiments, a bonding layer 154 can be formed on the lower gate structure, including the lower active gate cap 156, where the bonding layer 154 can be a bonding oxide layer (e.g., $SiO_2$) that secures the upper FET device to the lower FET device. The bonding layer 154 can separate the upper FET device from the lower FET device.

In one or more embodiments, an upper device channel can be formed over the lower FET device, where the upper device channel can include a stack of upper semiconductor nanosheets 132 on the bonding layer 154. The upper semiconductor nanosheets 132 can have a second width that is less than the first width of the lower semiconductor nanosheets 122.

In various embodiments, the upper gate structure can include a gate dielectric layer on the upper semiconductor nanosheets 132, and an upper conductive gate electrode 152 that wraps around the upper semiconductor nanosheets 132. An upper active gate cap 150 can be formed on the upper conductive gate electrode 152. The upper conductive gate electrode 152 can include a second work function material and/or a second conductive gate fill.

In one or more embodiments, a shared gate contact 190 can be formed between the upper conductive gate electrode 152 and the lower conductive gate electrode 158, where the shared gate contact 190 can intersect the active gate structure on the upper and lower device channels. The shared gate contact 190 can pass through the upper active gate cap 150, bonding layer 154, and the lower active gate cap 156.

In one or more embodiments, an upper gate contact 200 can be formed in the upper active gate cap 150, where the upper gate contact 200 can be in electrical contact with the upper conductive gate electrode 152.

In various embodiments, the dielectric gate cut slabs 160 can be on opposite ends of the upper and lower gate structures, where the dielectric gate cut slabs 160 can be an electrically insulating dielectric material, for example, silicon oxide (SiO).

Figure 3:
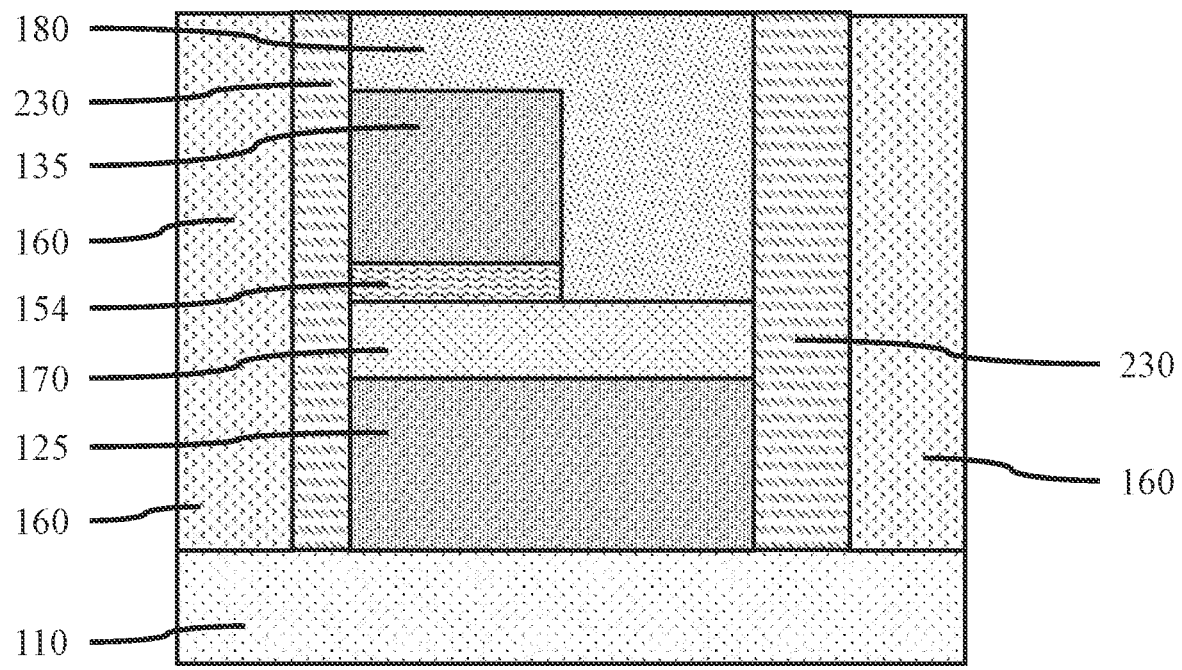
FIG. 3 is a cross-sectional side view showing the B-B cross-section of the top view in FIG. 1 along the long axis of the upper and lower device source/drains, and the shared source/drain contact on the field effect device, in accordance with an embodiment of the present invention.

FIG. 3 is a cross-sectional side view showing the B-B cross-section of the top view in FIG. 1 along the long axis of the upper and lower device source/drains, and the shared source/drain contact on the field effect device, in accordance with an embodiment of the present invention.

In one or more embodiments, the lower active device region 120 can also include a first lower source/drain 125 on a first side of the lower active gate structure. The first lower source/drain 125 can be in electrical contact with the lower semiconductor nanosheets 122. The first lower source/drain 125 can be n-doped or p-doped depending on the type of device being formed.

In one or more embodiments, the first upper active device region 130 can also include a first upper source/drain 135 on the first side of the active gate structure (the same side as the first lower source/drain 125). The first upper source/drain 135 can be in electrical contact with the upper semiconductor nanosheets 132. The first upper source/drain 135 can be n-doped or p-doped depending on the type of device being formed. The first upper source/drains 135 can be narrower than the first lower source/drains 125.

In various embodiments, the first lower source/drain contact interface 170 is on and in electrical contact with the first lower source/drain 125. The bonding layer 154 can be between the upper field effect device and the lower field effect device, where the bonding layer 154 can physically and electrically separate the first upper source/drain 135 from the first lower source/drain contact interface 170.

In various embodiments, the first lower source/drain contact interface 170 can be a metal, including, but not limited to, cobalt (Co), tungsten (W), ruthenium (Ru), a metal silicide, including, but not limited to, titanium silicide (TiSi), cobalt silicide (CoSi), tungsten silicide (WSi), and combinations thereof.

In one or more embodiments, the shared source/drain contact 180 can be formed on the first upper source/drain 135 and the first lower source/drain contact interface 170, where the shared source/drain contact 180 can form an electrical connection between the first upper source/drain 135 and the first lower source/drain contact interface 170. The shared source/drain contact 180 can pass through the bonding layer 154.

In various embodiments, the shared source/drain contact 180 can be a conductive material that can be a metal, including, but not limited to, cobalt (Co), tungsten (W), ruthenium (Ru), a metal silicide, including, but not limited to, titanium silicide (TiSi), cobalt silicide (CoSi), tungsten silicide (WSi), and combinations thereof.

In various embodiments, a dielectric fill layer 230 can be on the lower FET device and upper FET device, where the dielectric fill layer 230 can be between the FET devices and the dielectric gate cut slab 160. The dielectric fill layer 230 can be adjacent to the shared source/drain contact 180.

Figure 4:
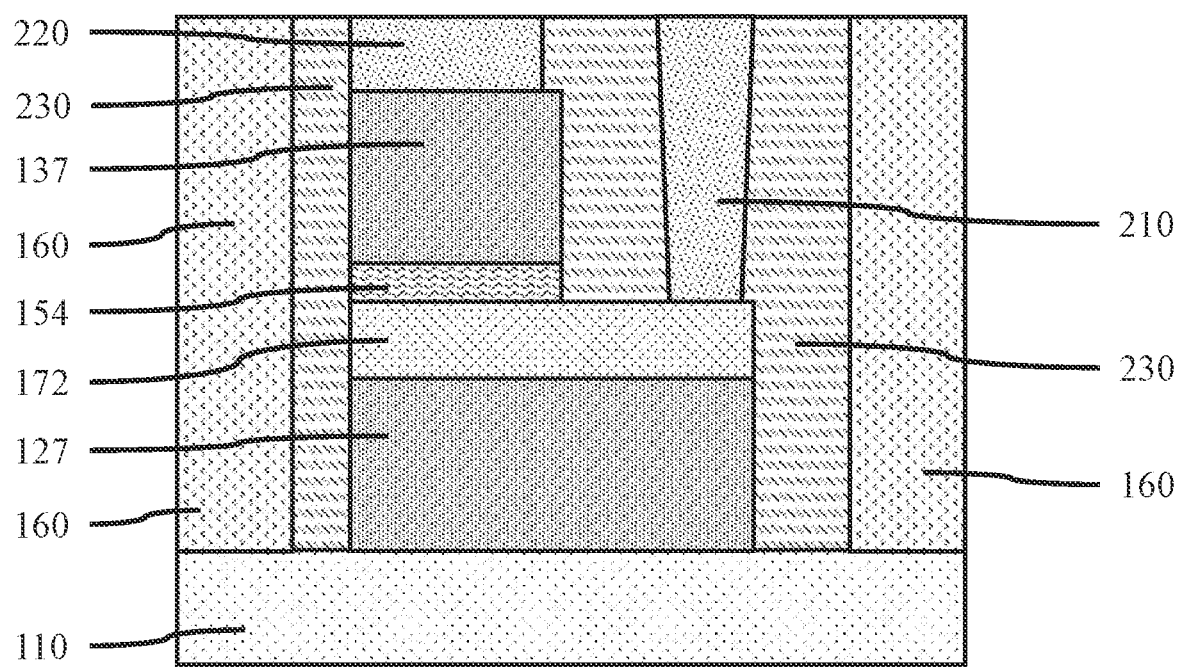
FIG. 4 is a cross-sectional side view showing the C-C cross-section of the top view in FIG. 1 along the long axis of the upper and lower device source/drains, and the separate source/drain contacts on the field effect device, in accordance with an embodiment of the present invention.

FIG. 4 is a cross-sectional side view showing the C-C cross-section of the top view in FIG. 1 along the long axis of the upper and lower device source/drains, and the separate source/drain contacts on the field effect device, in accordance with an embodiment of the present invention.

In one or more embodiments, the lower active device region 120 can also include a second lower source/drain 127 on a second side of the lower active gate structure opposite the first side. The second lower source/drain 127 can be in electrical contact with an opposite end of the lower semiconductor nanosheets 122 from the first lower source/drain 125.

In one or more embodiments, the upper active device region 130 can also include a second upper source/drain 137 on the second side of the upper active gate structure opposite the first side. The second upper source/drain 137 can be in electrical contact with an opposite end of the upper semiconductor nanosheets 132 from the first upper source/drain 135.

In various embodiments, the second lower source/drain contact interface 172 can be on and in electrical contact with the second lower source/drain 127, where the second lower source/drain contact interface 172 can be on the opposite side of the active gate structure from the first lower source/drain contact interface 170. The bonding layer 154 can be between the upper field effect device and the lower field effect device, where the bonding layer 154 can physically and electrically separate the second upper source/drain 137 from the second lower source/drain contact interface 172.

In one or more embodiments, a lower source/drain contact 210 can be formed on the second lower source/drain contact interface 172, where the lower source/drain contact 210 can form an electrical connection to the second lower source/drain 127 through the second lower source/drain contact interface 172.

In one or more embodiments, an upper source/drain contact 220 can be formed to the second upper source/drain 137 on the opposite side of the active gate structure from the shared source/drain contact 180. The upper source/drain contact 220 can be electrically connected to the second upper source/drain 137.

In various embodiments, a dielectric fill layer 230 can be on the lower FET device and upper FET device, where the dielectric fill layer 230 can be between the FET devices and the dielectric gate cut slab 160. The dielectric fill layer 230 can electrically insulate the various conductive components of the upper FET device and lower FET device.

Figure 5:
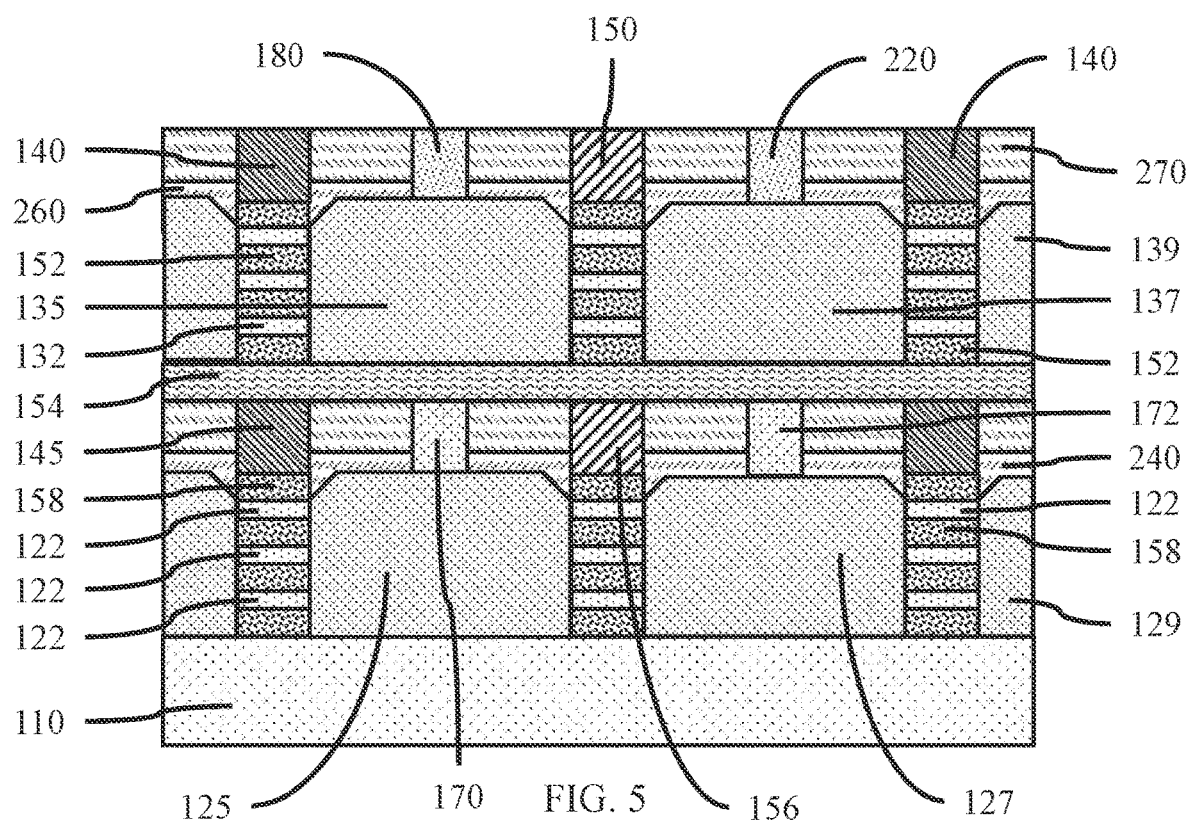
FIG. 5 is a cross-sectional side view showing the D-D cross-section of the top view in FIG. 1 across the gate structures, source/drains, shared source/drain contact, and separate source/drain contacts on the field effect device, in accordance with an embodiment of the present invention.

FIG. 5 is a cross-sectional side view showing the D-D cross-section of the top view in FIG. 1 across the gate structures, source/drains, shared source/drain contact, and separate source/drain contacts on the field effect device, in accordance with an embodiment of the present invention.

In one or more embodiments, a lower FET device can include a plurality of lower semiconductor nanosheets 122 in a stack on a substrate 110. A lower gate structure including a lower gate dielectric layer and a lower conductive gate electrode 158 can be formed on the lower semiconductor nanosheets 122, where the lower gate dielectric layer and a lower conductive gate electrode 158 wraps around each of the lower semiconductor nanosheets 122. A lower dummy gate cap 145 can be formed on the lower dummy gate structures on opposite sides of the lower active gate structure, where a lower gate contact would not be formed in the lower dummy gate cap 145. A lower active gate cap 156 can be formed on the lower conductive gate electrode 158 of the lower active gate structure.

In one or more embodiments, a lower source/drain can be formed on opposites sides of each stack of lower semiconductor nanosheets 122, where a first lower source/drain 125 can be formed on a first side of the lower active gate structure and a second lower source/drain 127 can be formed on a second side of the lower gate structure opposite the first side. In various embodiments, additional lower source/drains 129 can be formed on opposite sides of the lower dummy gate structures from the first lower source/drain 125 and the second lower source/drain 127.

In one or more embodiments, a lower dielectric protective liner 240 can be formed on the first lower source/drain 125, second lower source/drain 127, and additional lower source/drains 129, where the lower dielectric protective liner 240 can electrically insulate and protect the first lower source/drain 125, second lower source/drain 127, and additional source/drains 129 during subsequent fabrication processes.

In various embodiments, the lower dielectric protective liner 240 can be silicon nitride (SiN), silicon boro carbonitride (SiBCN), aluminum oxide (AlO$_x$), and combinations thereof.

In one or more embodiments, a lower dielectric cover layer 250 can be formed on the lower dielectric protective liner 240, where the lower dielectric cover layer 250 can be a dielectric material different from the lower dielectric protective liner 240 to provide etch selectivity.

In various embodiments, the lower dielectric cover layer 250 can be silicon nitride (SiN), silicon boro carbonitride (SiBCN), aluminum oxide (AlO$_x$), and combinations thereof.

In one or more embodiments, a first lower source/drain contact interface 170 and a second lower source/drain contact interface 172 can be formed through the lower dielectric cover layer 250 and the lower dielectric protective liner 240. The lower dielectric cover layer 250 and lower dielectric protective liner 240 and a lower gate dielectric layer can electrically insulate the lower conductive gate electrodes 158 from the first lower source/drain contact interface 170 and second lower source/drain contact interface 172.

In various embodiments, a separate lower etch-stop layer can be formed on the first lower source/drain 125, second lower source/drain 127, and additional lower source/drains 129.

In various embodiments, a bonding layer 154 can be formed on the lower dielectric cover layer 250 and top surfaces of the lower dummy gate cap(s) 145 and lower active gate cap(s) 156. The bonding layer can be an oxide layer (e.g., SiO$_2$) that can be utilized to attach semiconductor layer to the lower FET device to fabricate an upper FET device.

In one or more embodiments, an upper FET device can include a plurality of upper semiconductor nanosheets 132 in a stack on the bonding layer 154. An upper gate structure including an upper gate dielectric layer and an upper conductive gate electrode 152 can be formed on the upper semiconductor nanosheets 132, where the upper gate dielectric layer and upper conductive gate electrode 152 wraps around each of the upper semiconductor nanosheets 132 in an upper stack. An upper dummy gate cap 140 can be formed on each of the upper dummy gate structures on opposite sides of the upper active gate structure, where an upper gate contact would not be formed in the upper dummy gate caps 140. An upper active gate cap 150 can be formed on the upper conductive gate electrode 152 of the upper active gate structure.

In one or more embodiments, an upper source/drain can be formed on opposites sides of each stack of upper semiconductor nanosheets 132, where a first upper source/drain 135 can be formed on a first side of the upper active gate structure and a second upper source/drain 137 can be formed on a second side of the upper active gate structure opposite the first side. In various embodiments, additional upper source/drains 139 can be formed on opposite sides of the upper dummy gate structures from the first upper source/drain 135 and the second upper source/drain 137.

In one or more embodiments, an upper dielectric protective liner 260 can be formed on the first upper source/drain 135, second upper source/drain 137, and additional upper source/drains 139, where the upper dielectric protective liner 260 can electrically insulate and protect the first upper source/drain 135, second upper source/drain 137, and additional upper source/drains 139 during subsequent fabrication processes.

In various embodiments, the upper dielectric protective liner 260 can be can be silicon nitride (SiN), silicon boro carbonitride (SiBCN), aluminum oxide (AlO$_x$), and combinations thereof.

In one or more embodiments, an upper dielectric cover layer 270 can be formed on the upper dielectric protective liner 260, where the upper dielectric cover layer 270 can be a dielectric material different from the upper dielectric protective liner 260 to provide etch selectivity.

In various embodiments, the upper dielectric cover layer 270 can be can be silicon nitride (SiN), silicon boro carbonitride (SiBCN), aluminum oxide (AlO$_x$), and combinations thereof.

In one or more embodiments, the shared source/drain contact 180 and an upper source/drain contact 220 can be formed through the upper dielectric cover layer 270 and the upper dielectric protective liner 260. The upper dielectric cover layer 270 and upper dielectric protective liner 260 and upper gate dielectric layer can electrically insulate the upper conductive gate electrodes 152 from the upper source/drain contact 220 and shared source/drain contact 180.

In various embodiments, a separate upper etch-stop layer can be formed on the first upper source/drain 135, second upper source/drain 137, and additional upper source/drains 139.

Figure 6:
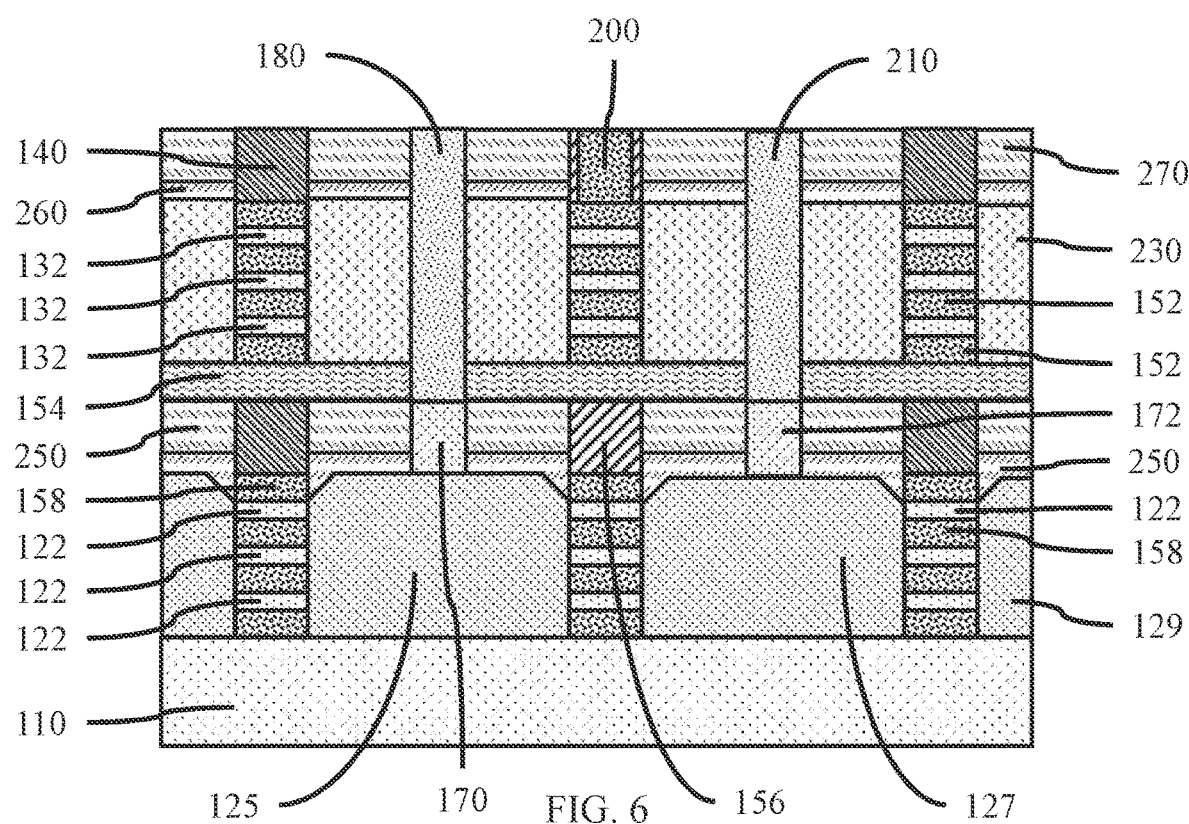
FIG. 6 is a cross-sectional side view showing the E-E cross-section of the top view in FIG. 1 across the gate structures, gate contact, source/drains, shared source/drain contact, and separate source/drain contacts on the field effect device, in accordance with an embodiment of the present invention.

FIG. 6 is a cross-sectional side view showing the E-E cross-section of the top view in FIG. 1 across the gate structures, gate contact, source/drains, shared source/drain contact, and separate source/drain contacts on the field effect device, in accordance with an embodiment of the present invention.

In one or more embodiments, the shared source/drain contact 180 can extend through the dielectric fill layer 230 and bonding layer 154 to the first lower source/drain contact interface 170. A lower source/drain contact 210 can extend through the dielectric fill layer 230 and bonding layer 154 to electrically connect to second lower source/drain contact interface 172. An upper gate contact 200 can be formed through the upper gate cap 150 to the upper conductive gate electrode 152 of the upper active gate structure.

Figure 7:
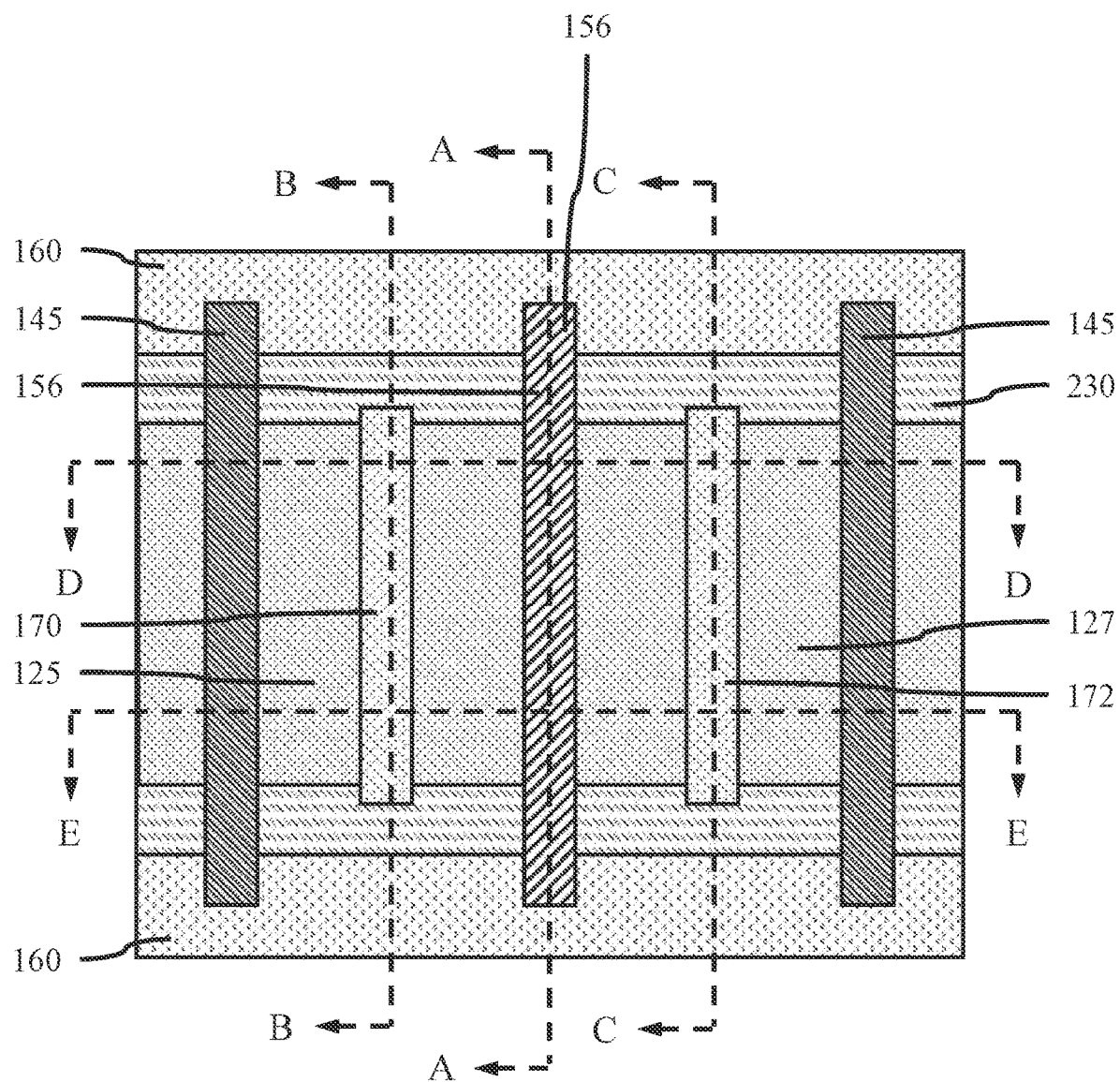
FIG. 7 is a top view showing a lower field effect device with gate structures and source/drain contacts, in accordance with an embodiment of the present invention.

FIG. 7 is a top view showing a lower field effect device with gate structures and source/drain contacts, in accordance with an embodiment of the present invention.

In various embodiments, a first lower source/drain contact interface 170 can be formed on the first lower source/drain 125 in the lower active device region 120 of the lower FET device on one side of the active gate structure. A second lower source/drain contact interface 172 can be formed on the second lower source/drain 127 in the lower active device region 120 of the lower FET device on one side of the active gate structure. The lower active gate cap 156 can be formed on the lower conductive gate electrode 158 of the lower active gate structure, and the lower dummy gate cap 145 can be formed on the lower conductive gate electrode 158 of the lower dummy gate structures.

Figure 8:
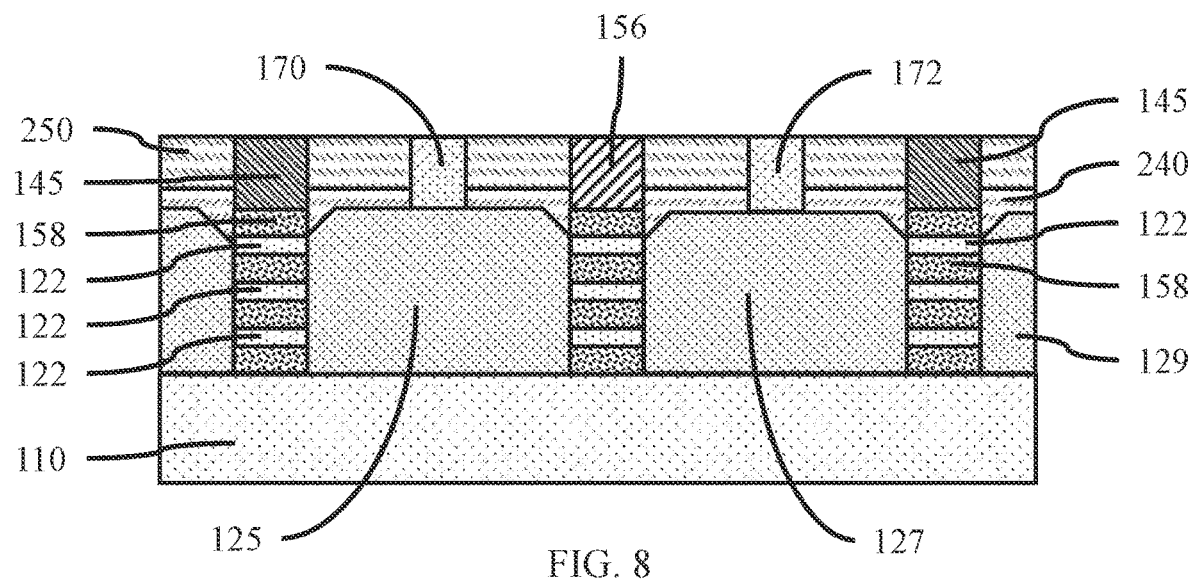
FIG. 8 is a cross-sectional side view showing the D-D cross-section of the top view in FIG. 7 across the gate structures, source/drains, shared source/drain contact, and separate source/drain contacts on the field effect device, in accordance with an embodiment of the present invention.

FIG. 8 is a cross-sectional side view showing the D-D cross-section of the top view in FIG. 7 across the gate structures, source/drains, shared source/drain contact, and separate source/drain contacts on the field effect device, in accordance with an embodiment of the present invention.

In one or more embodiments, a stack of lower semiconductor nanosheets 122 can be formed on a substrate 110. A first lower source/drain 125 can be formed on a first side of the stack of lower semiconductor nanosheets 122, and a second lower source/drain 127 can be formed on a second side of the stack of lower semiconductor nanosheets 122.

In one or more embodiments, a lower gate dielectric layer can be formed on the lower semiconductor nanosheets 122, and a lower conductive gate electrode 158 can be formed on the lower gate dielectric layer to form a lower gate structure on the substrate 110. A lower active gate cap 156 can be formed on the lower conductive gate electrode 158 of the lower active gate structure.

In one or more embodiments, a lower dielectric protective liner 240 can be formed on the first lower source/drain 125 and the second lower source/drain 127. A lower dielectric cover layer 250 can be formed on the lower dielectric protective liner 240.

A first lower source/drain contact interface 170 can be formed to the first lower source/drain 125 by forming an opening in the lower dielectric cover layer 250 and the lower dielectric protective liner 240, and filing the opening with a conductive material. A second lower source/drain contact interface 172 can be formed to the second lower source/drain 127 by forming an opening in the lower dielectric cover layer 250 and the lower dielectric protective liner 240, and filing the opening with a conductive material.

A lower dummy gate cap 145 can be formed on the lower dummy gate structures on opposite sides of the lower active gate structure, where a lower gate contact would not be formed in the lower dummy gate cap 145. Additional lower source/drains 129 can be formed on the lower semiconductor nanosheets 122 under the lower dummy gate structures.

Figure 9:
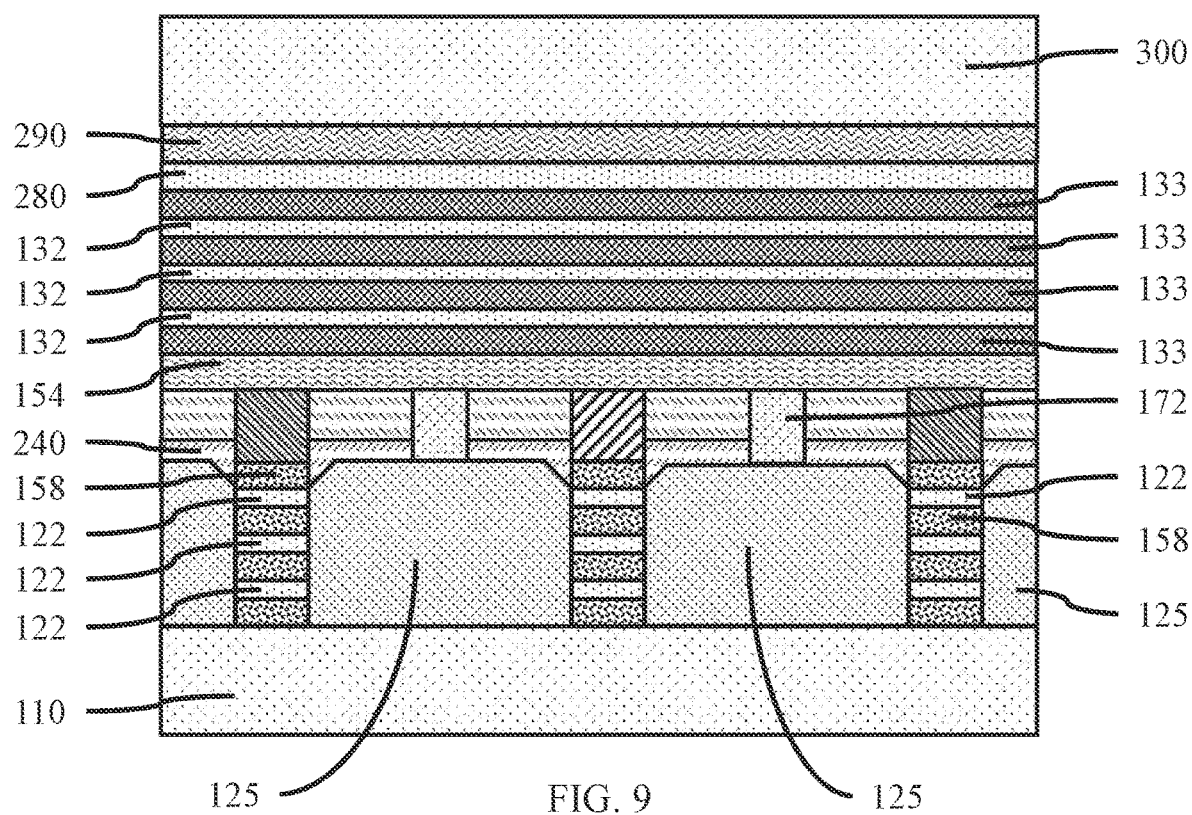
FIG. 9 is a cross-sectional side view showing the E-E cross-section of the top view in FIG. 7 across the gate structures, gate contact, source/drains, shared source/drain contact, and separate source/drain contacts after forming an upper channel stack on the lower device using a handle substrate, in accordance with an embodiment of the present invention.

FIG. 9 is a cross-sectional side view showing the E-E cross-section of the top view in FIG. 7 across the gate structures, gate contact, source/drains, shared source/drain contact, and separate source/drain contacts after forming an upper channel stack on the lower device using a handle substrate, in accordance with an embodiment of the present invention.

In one or more embodiments, a bonding layer 154 can be formed on the lower dielectric cover layer 250, lower active gate cap 156, and lower dummy gate cap 145. An upper channel stack of alternating upper semiconductor nanosheets 132 and upper sacrificial nanosheet layers 133 can be formed on the bonding layer 154. A top semiconductor layer 280 can be on the upper stack, where the top semiconductor layer 280 can provide a disposable surface for attaching the stack to a carrier layer 300 through an attachment layer 290. The attachment layer 290 can be a bonding oxide layer (e.g., $SiO_2$) that secures the carrier layer 300 to the top semiconductor layer 280. The carrier layer 300 can provide a substrate for handling and attaching the upper channel stack to the bonding layer 154 and lower FET devices.

In various embodiments, the attachment layer 290 can be dielectric materials, including, but not limited to, silicon oxide ($SiO_x$), silicon nitride (SiN), silicon boro carbonitride (SiBCN), aluminum oxide ($AlO_x$), and combinations thereof.

The carrier layer 300 can be a semiconductor or insulator material that can be selectively removed. The attachment layer 290 and top semiconductor layer 280 can also be selectively removed to expose the upper alternating stack.

Figure 10:
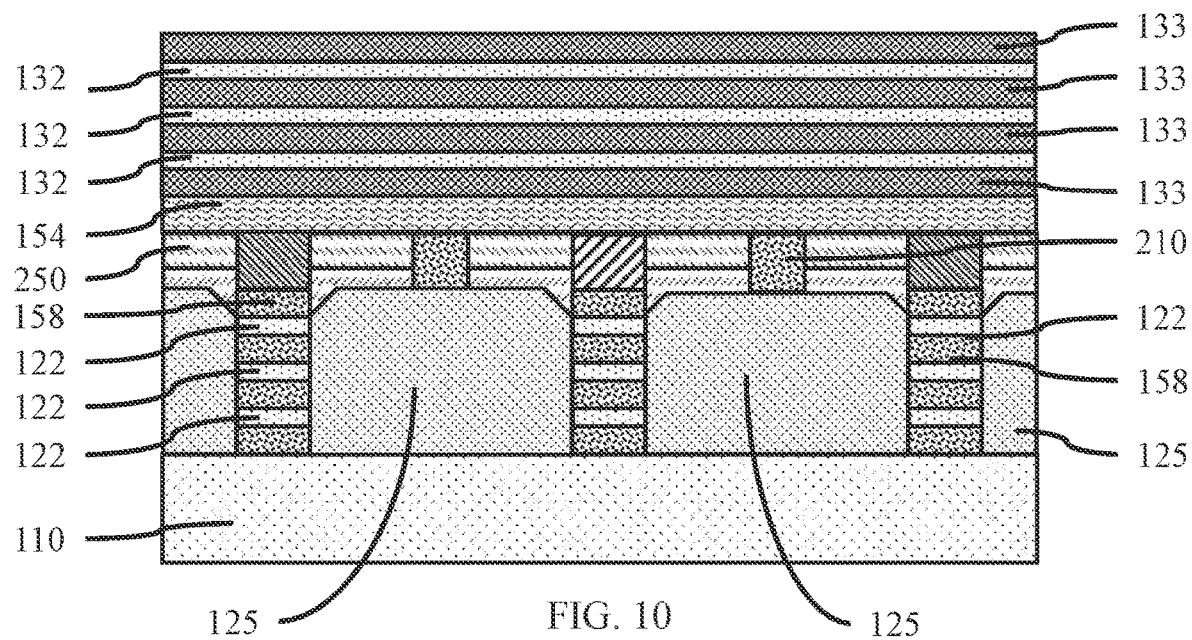
FIG. 10 is a cross-sectional side view showing the E-E cross-section of the top view in FIG. 7 across the gate structures, gate contact, source/drains, shared source/drain contact, and separate source/drain contacts after forming a channel stack on the lower device after removing the handle substrate, in accordance with an embodiment of the present invention.

FIG. 10 is a cross-sectional side view showing the D-D cross-section of the top view in FIG. 7 across the gate structures, gate contact, source/drains, shared source/drain contact, and separate source/drain contacts after forming a channel stack on the lower device after removing the handle substrate, in accordance with an embodiment of the present invention.

In one or more embodiments, the carrier layer 300 can be a semiconductor or insulator material that can be removed. The attachment layer 290 and top semiconductor layer 280 can be selectively removed to leave an upper sacrificial nanosheet layers 133 exposed at the top of the stack.

In various embodiments, the carrier layer 300 can be removed by selective etching away the attachment layer 290, and the exposed top semiconductor layer 280 can be selectively removed by etching.

Figure 11:
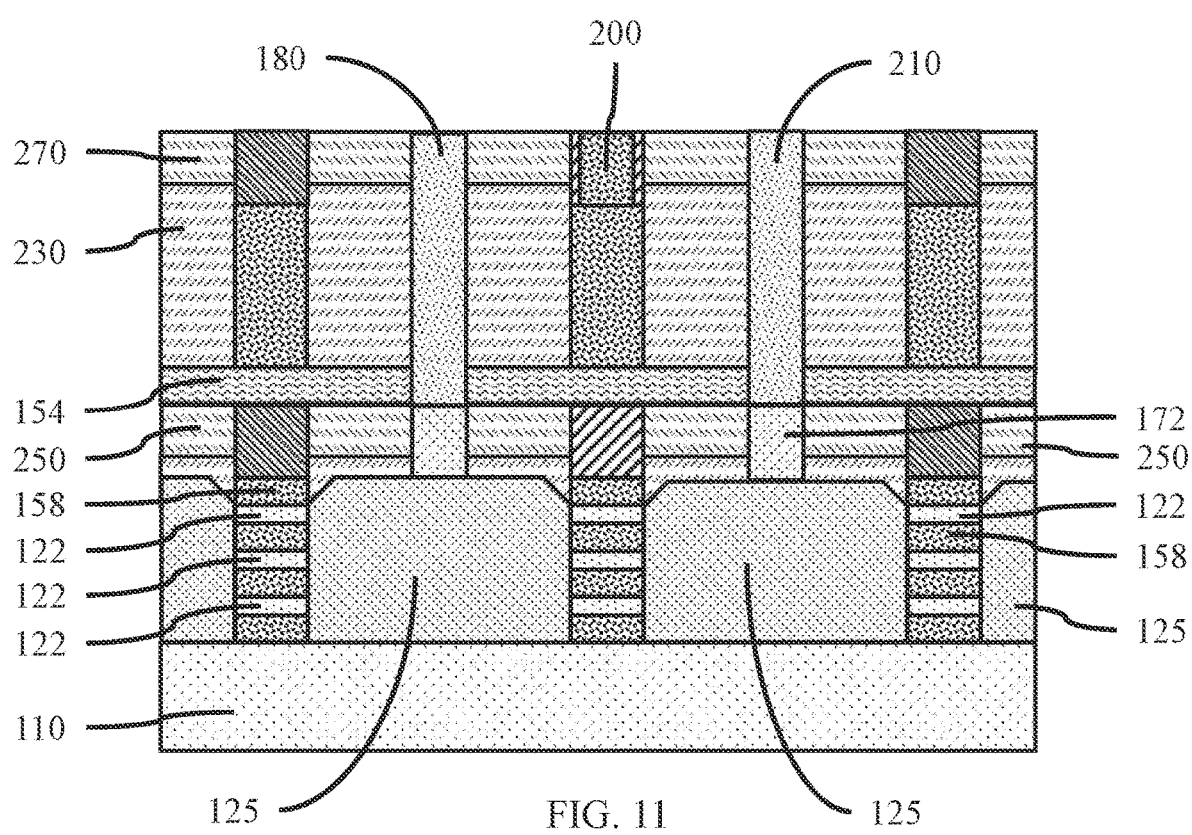
FIG. 11 is a cross-sectional side view showing the E-E cross-section of the top view in FIG. 7 across the gate structures, gate contact, source/drains, shared source/drain contact, and separate source/drain contacts on the field effect device, in accordance with an embodiment of the present invention.

FIG. 11 is a cross-sectional side view showing the E-E cross-section of the top view in FIG. 7 across the gate structures, gate contact, source/drains, shared source/drain contact, and separate source/drain contacts on the field effect device, in accordance with an embodiment of the present invention.

In one or more embodiments, a lower source/drain contact 210 can be formed on the second lower source/drain contact interface 172. The shared source/drain contact 180 can be formed on the first upper source/drain 135 and the first lower source/drain contact interface 170, where the shared source/ drain contact 180 can form an electrical connection between the first upper source/drain 135, the first lower source/drain contact interface 170, and the first lower source/drain 125. An upper gate contact 200 can be formed to the upper active gate structure.

Figure 12:
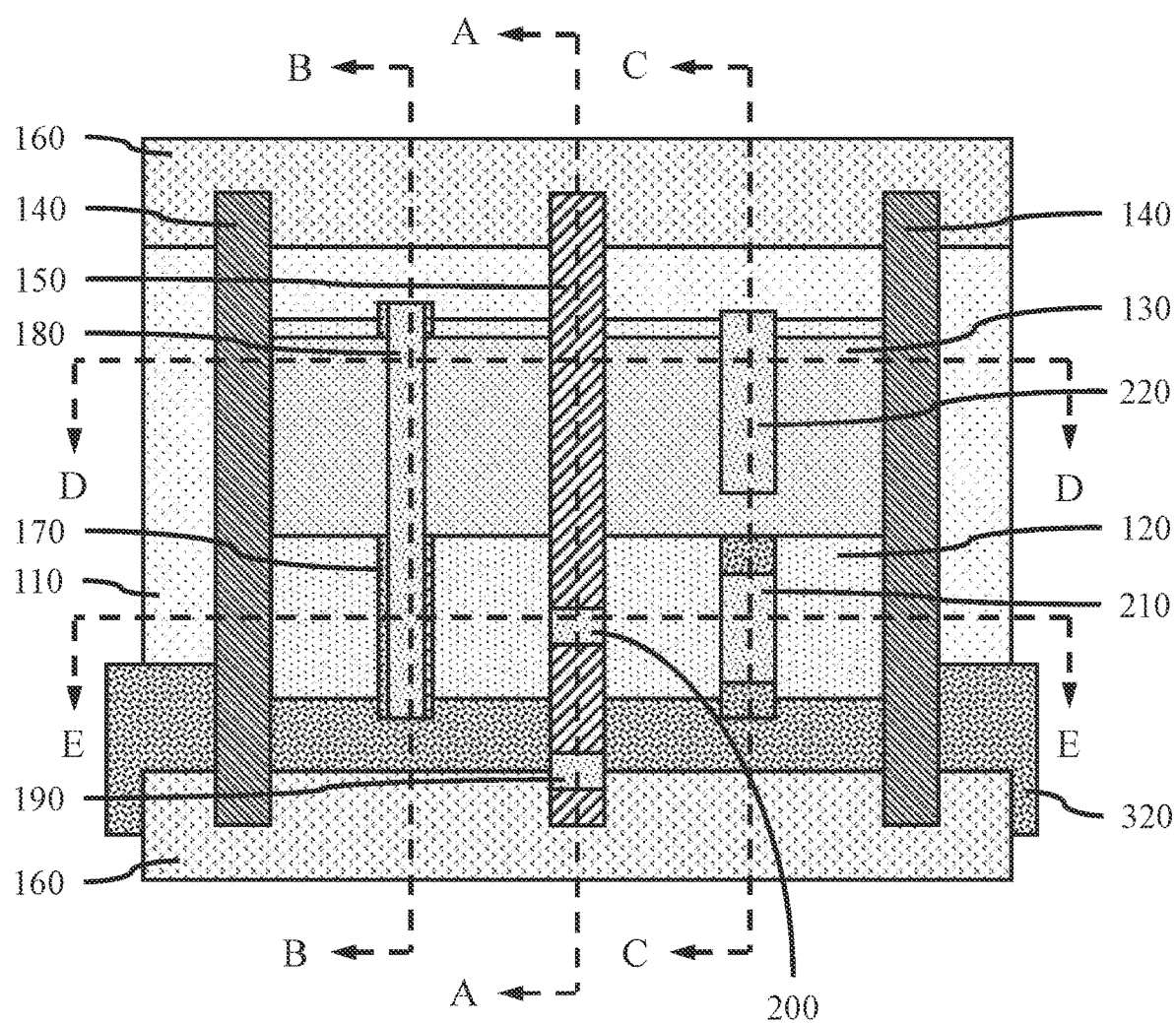
FIG. 12 is a top view showing a lower field effect device with gate structures, source/drain contacts, and a buried power rail, in accordance with another embodiment of the present invention.

FIG. 12 is a top view showing a lower field effect device with gate structures, source/drain contacts, and a buried power rail, in accordance with another embodiment of the present invention.

In one or more embodiments, a buried power rail 320 can be formed in the substrate 110 below the dielectric gate cut slab 160 and the first lower source/drain 125 and the second lower source/drain 127.

In one or more embodiments, the upper FET device can be formed on the lower FET device, where a buried power rail 320 is formed in the substrate 110. The buried power rail 320 can be formed below and laterally shift from the lower FET device by forming a trench in the substrate and filling the trench with a conductive material.

Figure 13:
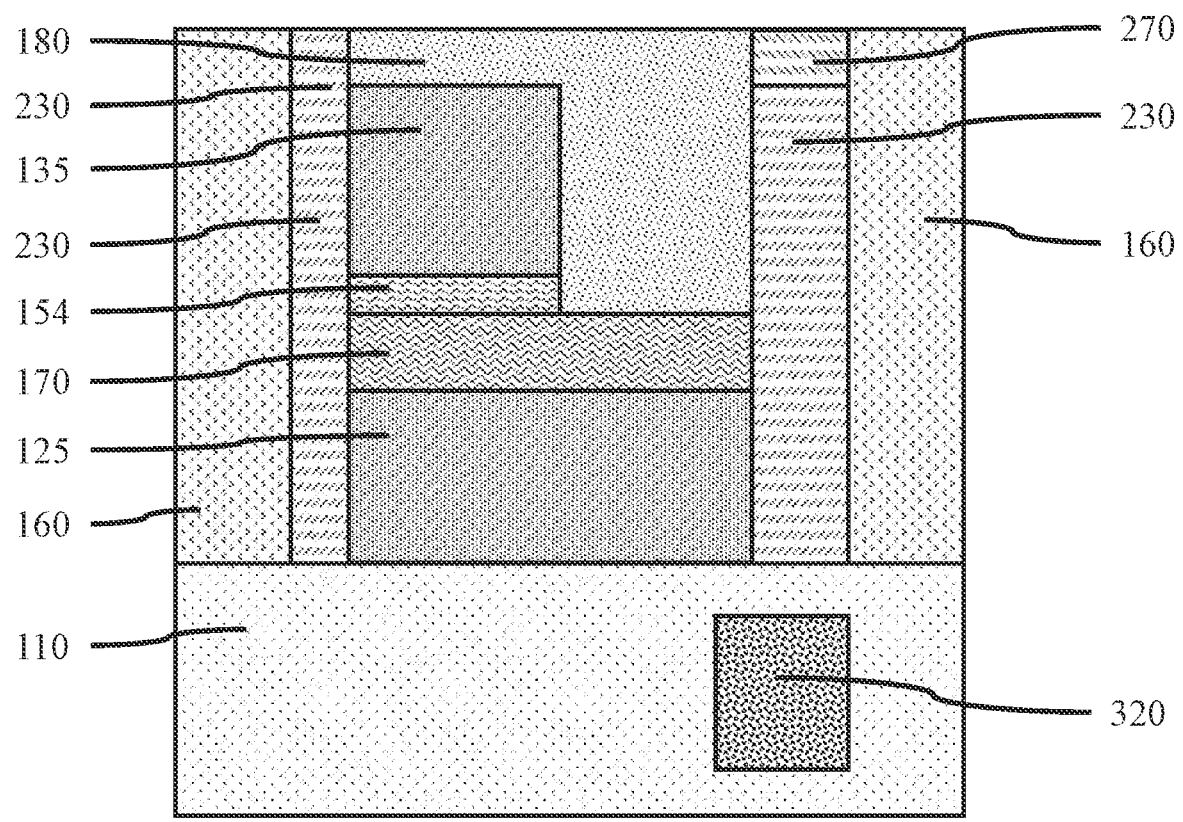
FIG. 13 is a cross-sectional side view showing the B-B cross-section of the top view in FIG. 12 along the long axis of the upper and lower device source/drains, and the separate source/drain contact on the field effect device with a buried power rail, in accordance with another embodiment of the present invention.

FIG. 13 is a cross-sectional side view showing the B-B cross-section of the top view in FIG. 12 along the long axis of the upper and lower device source/drains, and the separate source/drain contact on the field effect device with a buried power rail, in accordance with another embodiment of the present invention.

In one or more embodiments, the buried power rail can be below the first lower source/drain 125 and the second lower source/drain 127.

Figure 14:
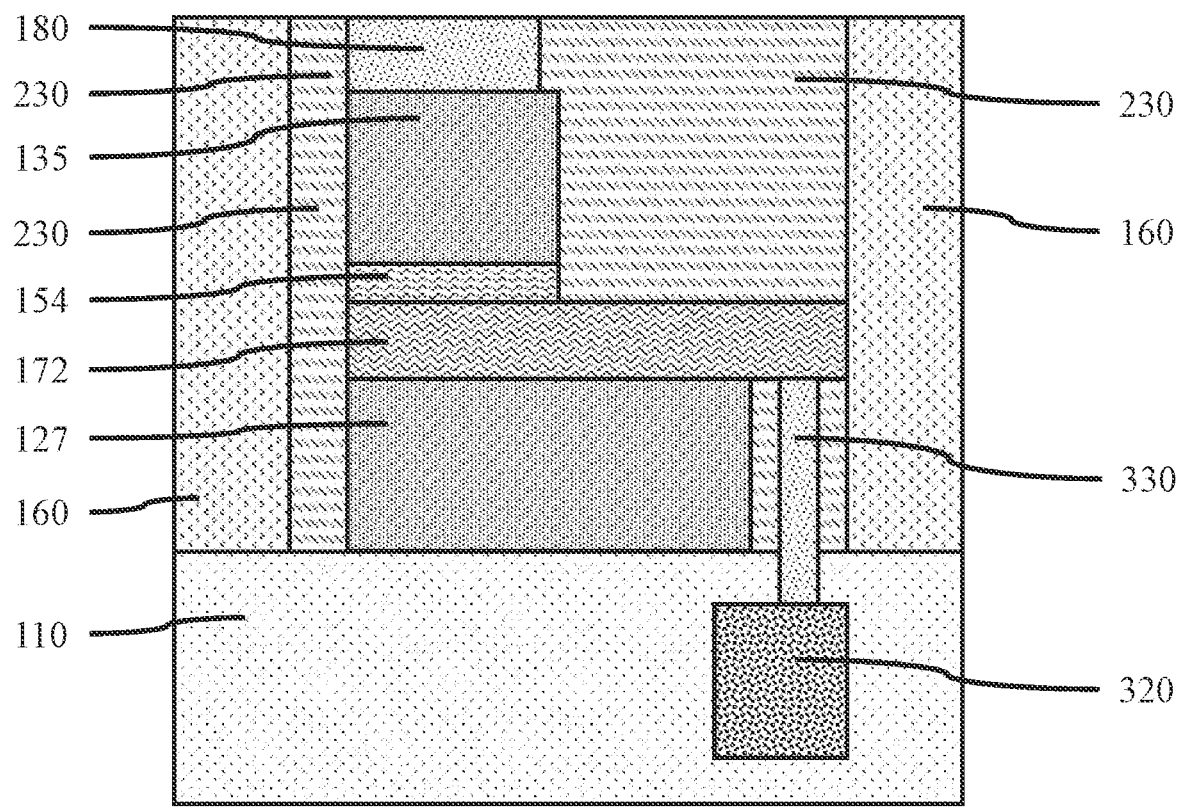
FIG. 14 is a cross-sectional side view showing the C-C cross-section of the top view in FIG. 12 along the long axis of the upper and lower device source/drains, and the buried power rail, in accordance with another embodiment of the present invention.

FIG. 14 is a cross-sectional side view showing the C-C cross-section of the top view in FIG. 12 along the long axis of the upper and lower device source/drains, and the buried power rail, in accordance with another embodiment of the present invention.

In one or more embodiments, the buried power rail 320 can be electrically connected to the second lower source/drain 127 through a buried power rail via 330, where the buried power rail via can be in electrical contact with a second lower source/drain contact interface 172 extended passed the second lower source/drain 127. The second lower source/drain contact interface 172 can be connect to the buried power rail via 330 and buried power rail 320, instead of the lower source/drain contact 210.

In various embodiments, the buried power rail 320 can be a metal, including, but not limited to, copper (Cu), tungsten (W), cobalt (Co), ruthenium (Ru), and combinations thereof.

In various embodiments, the buried power rail via 330 can be a metal, including, but not limited to, copper (Cu), tungsten (W), cobalt (Co), ruthenium (Ru), and combinations thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabrication the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A field effect device, comprising:
   a lower active gate structure on a substrate;
   a first lower source/drain on a first side of the lower active gate structure;
   a second lower source/drain on a second side of the lower active gate structure opposite the first side;
   a first lower source/drain contact interface on the first lower source/drain;
   a first upper source/drain on a first side of an upper active gate structure;
   a second upper source/drain on a second side of the upper active gate structure opposite the first side;
   a shared source/drain contact forming an electrical connection between the first lower source/drain and the first upper source/drain; and a lower source/drain contact forming an electrical connection to the second lower source/drain.

2. The field effect device of claim 1, further comprising one or more lower semiconductor nanosheets between the first lower source/drain and the second lower source/drain.

3. The field effect device of claim 2, further comprising one or more upper semiconductor nanosheets between the first upper source/drain and the second upper source/drain, wherein the one or more lower semiconductor nanosheets have a first width and the one or more upper semiconductor nanosheets have a second width less than the first width.

4. The field effect device of claim 3, wherein the lower active gate structure includes a lower conductive gate electrode on the one or more lower semiconductor nanosheets, and the upper active gate structure includes an upper conductive gate electrode on the one or more upper semiconductor nanosheets.

5. The field effect device of claim 4, further comprising a shared gate contact between the upper conductive gate electrode and the lower conductive gate electrode.

6. The field effect device of claim 5, further comprising a bonding layer between the upper conductive gate electrode and the lower conductive gate electrode, and between the first lower source/drain and the first upper source/drain.

7. The field effect device of claim 6, further comprising a first dummy gate structure adjacent to the first lower source/drain and the first upper source/drain, and a second dummy gate structure adjacent to the second lower source/drain and the second upper source/drain.

8. The field effect device of claim 7, wherein the shared source/drain contact is made of a conductive material selected from the group consisting of cobalt (Co), tungsten (W), ruthenium (Ru), and combinations thereof.

9. A field effect device, comprising:
   a first lower source/drain on a substrate;
   a second lower source/drain on the substrate;
   one or more lower semiconductor nanosheets between the first lower source/drain and the second lower source/drain;
   a first lower source/drain contact interface on the first lower source/drain;
   a first upper source/drain above the first lower source/drain;
   a second upper source/drain above the second lower source/drain;
   one or more upper semiconductor nanosheets between the first upper source/drain and the second upper source/drain;
   a shared source/drain contact forming an electrical connection between the first lower source/drain and the first upper source/drain; and
   a lower source/drain contact forming an electrical connection to the second lower source/drain.

10. The field effect device of claim 9, further comprising a lower conductive gate electrode on the one or more lower semiconductor nanosheets.

11. The field effect device of claim 10, further comprising an upper conductive gate electrode on the one or more upper semiconductor nanosheets.

12. The field effect device of claim 11, further comprising a shared gate contact between the upper conductive gate electrode and the lower conductive gate electrode.

13. The field effect device of claim 12, further comprising a bonding layer between the upper conductive gate electrode and the lower conductive gate electrode.

14. The field effect device of claim 12, further comprising an upper active gate cap on the upper conductive gate electrode, and an upper gate contact through the upper active gate cap to the upper conductive gate electrode.

\* \* \* \* \*